United States Patent [19]
Kendall

[11] 4,114,149
[45] Sep. 12, 1978

[54] CURRENT COMPARATOR FOR AN IMPROVED ANALOG-TO-DIGITAL CONVERTER METHOD AND APPARATUS

[75] Inventor: Larry J. Kendall, San Jose, Calif.

[73] Assignee: Fairchild Camera and Instrument Corporation, Mountain View, Calif.

[21] Appl. No.: 706,668

[22] Filed: Jul. 19, 1976

[51] Int. Cl.$^2$ .................................... H03K 13/03
[52] U.S. Cl. ................... 340/347 AD; 307/362; 307/363; 340/347 M
[58] Field of Search ............... 340/347 AD, 347 M; 330/30 D; 307/362, 363

[56] References Cited

U.S. PATENT DOCUMENTS

| | | | |
|---|---|---|---|
| 3,573,796 | 4/1971 | Querishi | 340/347 AD |
| 3,577,194 | 5/1971 | Beall | 340/347 M |
| 3,678,501 | 7/1972 | Prill | 340/347 M |
| 4,004,158 | 1/1977 | Morgan | 330/30 D X |
| 4,032,801 | 6/1977 | Fulkerson | 307/362 |

OTHER PUBLICATIONS

Engineering Staff of Analog Devices, Inc., Analog–Digital Conversion Handbook, Jun. 1972, pp. III–80 to III–82.

*Primary Examiner*—Thomas J. Sloyan
*Attorney, Agent, or Firm*—Alan H. MacPherson; Robert C. Colwell; Paul J. Winters

[57] ABSTRACT

A circuit for sensing the polarity of a net input current at a current summing node. The circuit has low impedance differential voltage outputs, accepts large input current overloads, has fast recovery, low input impedance, wide bandwidth and high sensitivity. The circuit is particularly well suited for improving the performance of analog-to-digital converters of the type which match, through successive trials at a summing node, the output of a digital-to-analog converter with an unknown input signal. The invention replaces a voltage comparator conventionally connected at such a summing node and allows such improved converters to be clocked faster. Higher speed operation is possible because the effect of the capacitance at the output of the digital-to-analog converter is reduced thereby shortening the voltage settling time at the summing node.

2 Claims, 5 Drawing Figures

CURRENT COMPARATOR FOR AN IMPROVED ANALOG-TO-DIGITAL CONVERTER METHOD AND APPARATUS

BACKGROUND OF THE INVENTION

1. Field of the Invention

This invention relates generally to electronic comparators and specifically to a circuit for sensing the polarity of a net input current at a current summing node. The invention is particularly well suited for providing an improved apparatus and method for analog-to-digital signal conversion.

2. Description of the Prior Art

The growth of fast computer and microprocessor controlled systems has created considerable demand for low-cost, high-speed analog-to-digital (A/D) converters. Many such converters are known and exploit a variety of algorithms to arrive at the desired digital output signal. Successive approximation A/D conversion is a popular choice in many systems today because it achieves high conversion rates at low cost. Other methods such as tracking (servo) or staircase (ramp) can require up to "$2n$" clock cycles per conversion, where "$n$" is the number of bits of resolution, while successive approximation requires only "$n+1$" clock cycles. In the successive approximation method, a series of known electrical voltages or currents are generated on a trial basis, typically by a digital-to-analog (D/A) converter, and are compared with the analog input signal of unknown value. The first trial compares the analog input to the value of the Most Significant Bit (MSB) or approximately one-half full scale. If the input is greater than the MSB value, the MSB is retained and the converter moves on to trying the next most significant bit, or approximately three-quarters full scale. If the input had been less than the MSB, the logic would have turned the MSB off before going on to the next most significant bit, one-quarter full-scale. This branching continues until each successively smaller bit has been tried, with the entire process taking "$n$" trials. The digital number best representing the analog input voltage is then available from the input to the D/A converter as a readout. U.S. Pat. No. 3,836,905 issued Sept. 17, 1974, to Charles Cross entitled "Analog-to-Digital Converter" provides a detailed discussion of logic which can be used to implement the successive approximation algorithm discussed above.

Early A/D converters performed a comparison between the analog input voltage and the output voltage from a D/A converter by applying these voltages respectively to a pair of input terminals on a voltage comparator. Later A/D converter designs achieved higher conversion speeds by using the output of a fast current output D/A converter directly at a current summing node. In such converters, higher conversion speed is achieved by eliminating the need for a current-to-voltage converting operational amplifier in the D/A converter which is by far the slowest element in such converters.

One of the problems involved with high speed conversion is the stray capacitance at the summing node. The largest component of this stray capacitance is associated with the output of the D/A converter. To ensure accuracy, it is generally accepted that the voltage at the summing node must settle to within one-half of the Least Significant Bit (LSB) before each of the trial comparisons can be made. Some prior art A/D converters have employed clamping devices such as, for example, Schottky diodes to reduce the voltage swing at the summing node thereby decreasing the effect of stray capacitance at the node. However, the effectiveness of such clamps is limited because of the exponential nature of the discharge rate at the summing node. U.S. Pat. No. 3,811,125 issued to Robert W. Schumann on May 14, 1974, entitled, "Analog-to-Digital Converter" teaches the use of a diode clamp and a clock controlled periodic current to hasten the return of the voltage at the summing node to a predetermined value prior to each trial comparison thereby achieving higher conversion speeds. Additionally, the patent provides a good, general discussion of factors affecting the settling time of the summing node.

Notwithstanding the many prior art improvements of which the above examples are but illustrative, conversion speed in successive approximation-type A/D converters remains a problem. A limitation that all prior art designers of A/D converters labored under was the essentially voltage sensitive nature of all heretofore known comparator circuits. For proper operation, such comparator circuits require that the voltage at the summing node change not insignificantly thereby requiring the stray capacitance to be charged and subsequently discharged. Although those skilled in the art will appreciate that the distinction between a comparator circuit being voltage sensitive or current sensitive is in a sense somewhat philosophical, the apparatus of the present invention will be understood as being predominantly current sensitive.

SUMMARY OF THE INVENTION

The present invention overcomes many of the disadvantages associated with analog-to-digital comparators known in the prior art. It does so by providing a novel bipolar current sensing structure including input means possessing a low impedance summing node for providing a single ended control voltage in response to bipolar input currents at the summing node, a source of selected reference voltage, and differential amplifier means possessing a first input connected to the single ended control voltage, a second input connected to the reference voltage, a current feedback node connected to the summing node, and first and second low impedance differential output voltage nodes for providing an input current nulling feedback current at the summing node and a selected one of two stable differential voltage relationships at the output nodes when the input current is of one polarity and the other stable differential voltage relationship when the input current is of the other polarity.

The present invention further provides an improved analog-to-digital converter of the type possessing a summing node, analog signal input means for providing a to-be-measured input current to the summing node, and digital-to-analog converter means for providing a series of trial currents to the summing node, each trial current for a predetermined period of time and each trial current related to a digital number wherein the improvement includes sensing means connected to the summing node for sensing the polarity of net current at the summing node at a selected time within each predetermined period.

A still further provision of the present invention is an improved method of measuring an input signal to an analog-to-digital converter comprising the steps of: providing the input signal to a summing node; providing a series of trial currents to the summing node, each trial current for a predetermined period of time and each trial current related to a digital number; and sensing the polarity of net current at the summing node with a current comparator at a selected time within each predetermined period.

BRIEF DESCRIPTION OF THE DRAWINGS

The many objects and advantages of the present invention will become apparent to those skilled in the art when the following description of the best mode contemplated for practicing the invention is read in conjunction with the accompanying drawings, wherein like reference characters refer to the same or similar elements, and in which.

DETAILED DESCRIPTION OF THE PREFERRED EMBODIMENT

The operation of the present invention is best understood by contrast with a typical prior art A/D converter which employs a voltage comparator. Although the design of prior art A/D converters and voltage comparators vary, the problems related to conversion speed are similar. The configuration shown in FIG. 1 was chosen for description because the current comparator of the invention can be substituted directly therein for the voltage comparator to provide an improved A/D converter capable of high speed operation.

Figure 1:
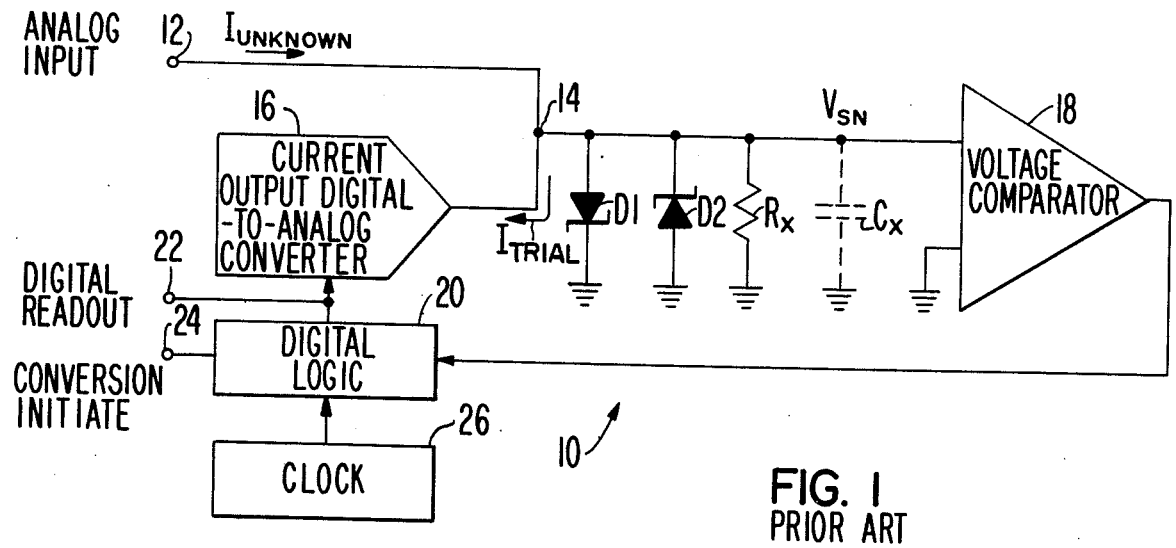
FIG. 1 is a block schematic diagram of a typical prior art analog-to-digital converter.

The prior art A/D converter 10 shown in FIG. 1 possesses an analog input terminal 12 connected through an input resistance (not shown) to a summing node 14. A current output from a digital to analog converter 16 is similarly connected together with a voltage input terminal on a voltage comparator 18 to the summing node 14. The voltage comparator 18 has an output which is connected to digital logic circuitry indicated as a box 20. The digital logic circuitry possesses an output connected to a digital readout terminal 22 and an input on the D/A converter 16. Additionally, the digital logic circuitry 20 possesses a conversion initiate terminal 24 and an input terminal for receiving a periodic timing signal from a clock 26.

A pair of clamping diodes D1 and D2 are connected between the summing node 14 and ground. The Schottky diodes shown restrict the swing of the voltage at the summing node $V_{SN}$ to approximately ±0.3 volts. An effective summing node load resistance $R_x$ is shown connected between the summing node 14 and ground. This resistance includes the input resistance not shown between the analog input terminal 12 and the summing node 14 and the resistance seen looking into the input of the voltage comparator 18. The value of $R_x$ can be varied to achieve operating speed/power tradeoffs as will be discussed below. The total parasitic capacitance at the summing node $C_x$ is represented by a capacitor symbol formed with broken lines connected between the summing node 14 and ground. $C_x$ includes the input capacitance of the voltage comparator 18 and the output capacitance of the digital-to-analog converter 16. The value of $C_x$ is dictated in large measure by the output capacitance of the D/A converter 16 which in typical 12-bit monolithic embodiments possesses a value of 30 pF. In the A/D converter 10, the comparison time is the settling time of the summing node 14 plus the response time of the voltage comparator 18. Normally, the summing node settling time is the dominant factor because of the capacitance $C_x$.

For purposes of example it is assumed that the A/D converter 10 provides 12-bit digital resolution with a full-scale current output from the D/A converter 16 of 2000μA. It is further assumed that the capacitance $C_x$ has a value of 30 pF, and the load resistance $R_x$ has a value of 10K ohms. Therefore, the trial current ($I_{TRIAL}$) associated with the MSB has a value of 1000μA (one-half the full-scale current) and the LSB has an $I_{TRIAL}$ value of approximately 0.5μA (1/4096th of the full-scale current). The worst case comparison times occur when the analog input current $I_{UNKNOWN}$ has a value of 500 or 1,500μA (one-quarter or three-quarters of the full-scale output current from the D/A converter 16). In these cases, during the first trial comparison for the MSB when $I_{TRIAL}$ = 1000 μA there is a 500μA net current overload at the summing node 14. This overload current will charge the capacitance $C_x$ to ± 300mV. Further charging of the capacitance is limited by the action of the Schottky diodes D1 and D2. $V_{SN}$ = ±300mV is sufficient to provide a fast definite comparison at the output of the comparator 18. During the second trial period, (assuming $I_{UNKNOWN}$ = 500μA) there will be zero overload current at the summing node 14. To ensure accurate operation, the voltage at the summing node $V_{SN}$ must settle to within one-half the maximum voltage produced under steady-state conditions by the trial current $I_{TRIAL}$ associated with the LSB before the current comparison can be made. In this example, $I_{TRIAL}$ = 500μA for the LSB. Using Ohm's law, $V_{SN}$ = 0.5μA × 10KΩ = 5mV. Five RC time constants are required to discharge the capacitance $C_x$ to within 1% (± 3mV) of its fully charged voltage (+ 300mV). The RC time constant for the component values assumed in this example is 300nS ($R_xC_x$ = 10K Ω × 30 pF = 300nS). Therefore, the required summing node settling time is 1500 nS, (300nS × 5).

As stated above, the total comparison time is equal to the summing node settling time (1500 nS) plus the time required by the voltage comparator 18 to respond to the minimum summing node voltage $V_{SN}$ provided under worst case conditions. Conditions are worst and $V_{SN}$ is at a minimum when a maximum residual error voltage (± 3mV) is canceled by the opposite voltage (approximately ∓ 5mV) generated by the trial current associated with the least significant bit ($I_{TRIAL}$ + 0.5μA). The time required by selected prior art voltage comparators 18 to respond to an input voltage of ± 2mV is small compared to the summing node settling time of 1500nS.

The summing node settling time can be reduced by making the RC time constant smaller. However, if $R_x$ is reduced, for example by a factor of 2, then the maximum voltage at the summing node 14 produced under steady-state conditions by the trial current $I_{TRIAL}$ associated with the LSB is 2.5mV (0.5μA × 5KΩ). This value is easily masked by the maximum residual error voltage (+3mV) and circuit noise due to electrical transients. $I_{TRIAL}$ for the LSB can be raised to overcome this low voltage problem by increasing the full scale output current from the D/A converter. However, power dissipation in monolithic D/A converters quickly becomes excessive and the capacitance $C_x$ generally also increases. Reducing $C_x$ is clearly the most desirable way to make the RC time constant smaller thereby shortening the settling time. Unfortunately, the largest component of $C_x$ is inherent at the output of the D/A converter 16 and little can be done to reduce it.

Figure 2:
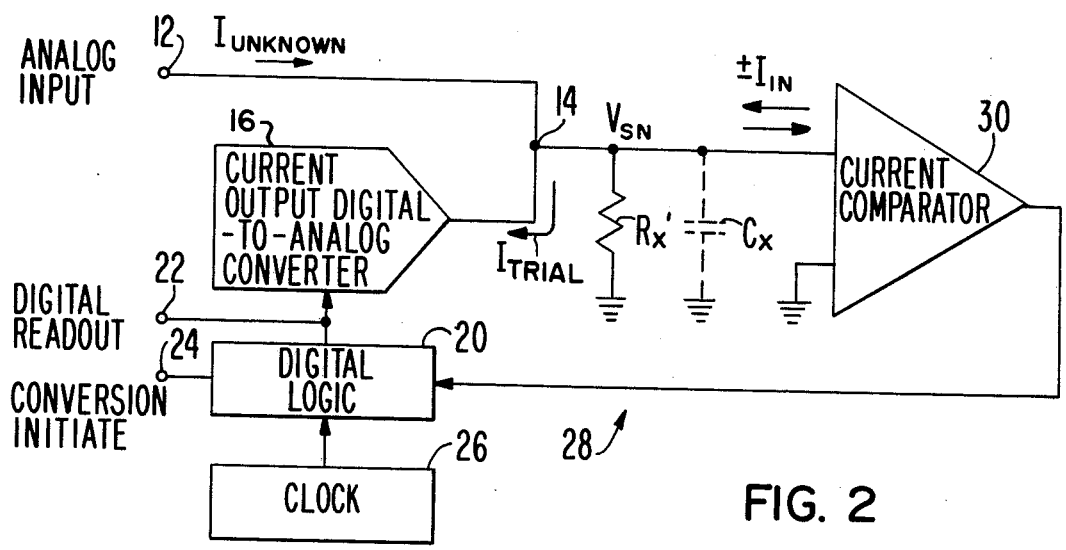
FIG. 2 is a block schematic diagram of an improved analog-to-digital converter incorporating the present invention.

In contrast to the prior art A/D converter 10 shown in FIG. 1 which incorporates a conventional voltage comparator 18, FIG. 2 shows an improved A/D converter 28 incorporating a novel current comparator 30. In operation, the current comparator 30 senses the polarity of a net input current $\pm I_{IN}$ at the current summing node 14. Additionally, the current comparator 30 provides an input current nulling feedback current which tends to maintain the voltage at the summing node $V_{SN}$ at a predetermined value. Because the voltage $V_{SN}$ does not change appreciably, the total capacitance at the summing node $C_x$ is not charged and therefore need not be discharged. For the same reason, clamping diodes are not normally required at the summing node 14 to restrict the swing of $V_{SN}$. However, it is to be understood that such diodes can be provided if so desired to afford protection against excessive input signals and unexpected transients. The improved A/D converter 28 can be clocked faster than similar converters known in the prior art because the summing node settling time is greatly reduced.

Figure 3:
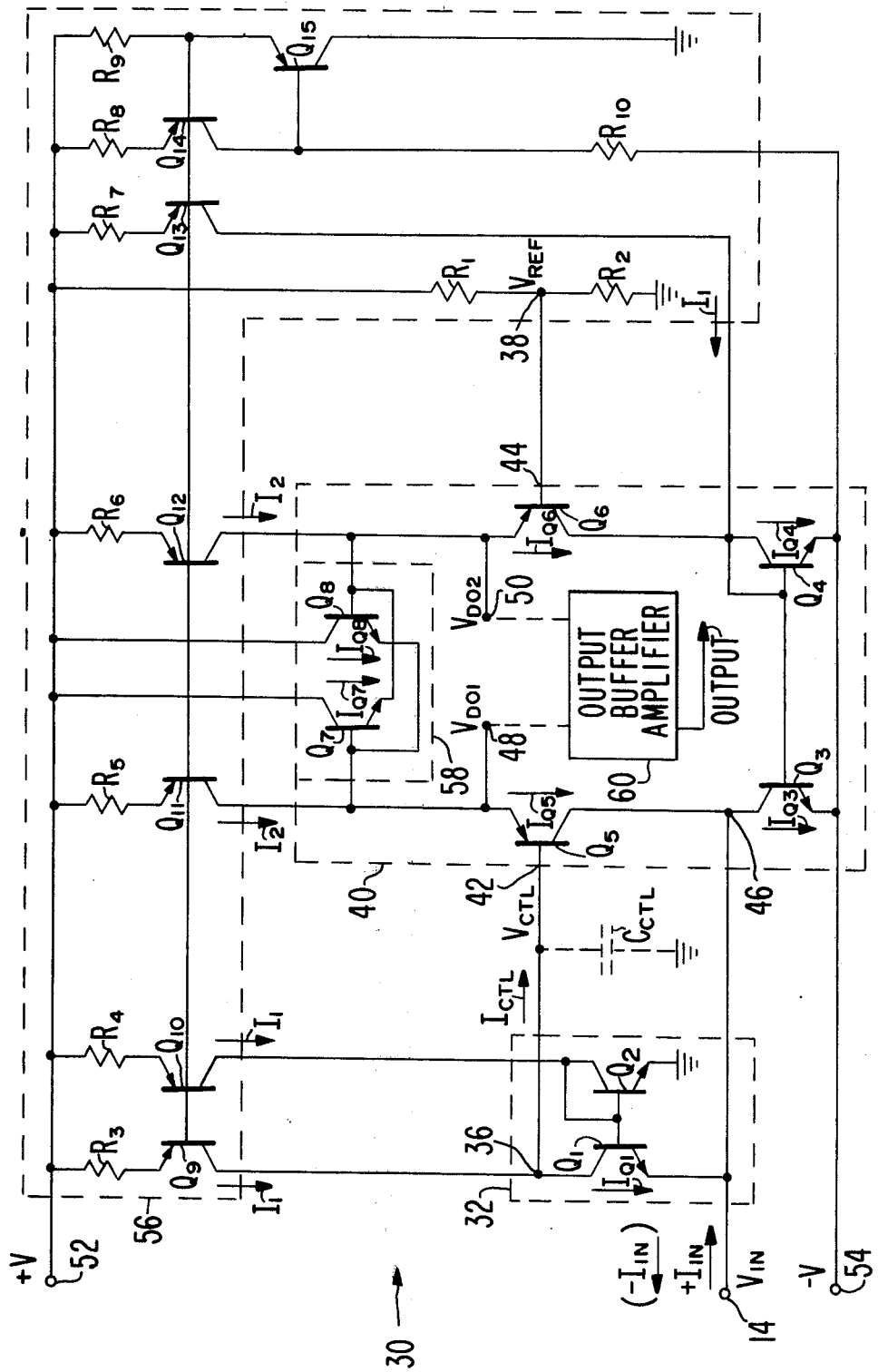
FIG. 3 is a schematic diagram of a presently preferred embodiment of the invention.

FIG. 3 is a schematic diagram of a bipolar current sensing structure suitable for use as a current comparator 30 in the improved A/D converter 28 shown in FIG. 2. The structure 30 possesses input means 32 represented by a box bounded by broken lines for providing a single ended control voltage $V_{CTL}$ at a control node 36 in response to net bipolar input currents $\pm I_{IN}$ at a summing node 14. A source of selected reference voltage $V_{REF}$ is provided at a node 38 as shown. A differential amplifier means 40 represented by a box formed with broken lines possesses a first input 42 connected to the single ended control voltage $V_{CTL}$ at the control node 36, a second input 44 connected to the reference voltage $V_{REF}$ at the node 38, a current feedback node 46 connected to the summing node 14 and first and second low impedance differential output voltage nodes 48 and 50 respectively. The differential amplifier means 40 functions to provide an input current nulling feedback current at the summing node 14 and a selected one of two stable differential voltage relationships at the output nodes 48 and 50 when the input current $I_{IN}$ is of one polarity and the other differential voltage relationship when the input current is of the other polarity. Selected positive and negative supply voltages $+V$ and $-V$ are connected respectively at a pair of nodes 52 and 54 as shown. A power supply 56 is shown bounded by a broken line and provides, in addition to the reference voltage $V_{REF}$, five constant currents. Three of the constant currents are of magnitude $I_1$ and the remaining two constant currents are of a magnitude $I_2$.

The input means 32 is formed with a pair of NPN type transistors Q1 and Q2 connected as shown. First and second constant current sources of magnitude $I_1$ are connected respectively to the collectors of the transistors Q1 and Q2. A constant current of magnitude $I_1$ flows continuously through the self-biased transistor Q2 to ground thereby biasing the transistor Q1. Absent any input current at the summing node 14, the first constant current of magnitude $I_1$ flows into the control node 36 through the transistor Q1 and into the feedback node 46.

The differential amplifier means 40 includes a pair of NPN type transistors Q3 and Q4 having their bases connected together and their respective emitters connected to the source of selected negative supply voltage $-V$. A pair of PNP transistors Q5 and Q6 have their collectors connected respectively to the collectors of the transistors Q3 and Q4. The base of the transistor Q5 forms the first input 42 of the amplifier means 40 and is connected to the control node 36. The base of the transistor Q6 forms the second input 44 of the amplifier means 40 and is connected to $V_{REF}$ at the node 38. The emitters of the transistors Q5 and Q6 form respectively the first and second low impedance differential output voltage node 48 and 50. Third and fourth current sources which each provide a constant current of magnitude $I_2$ are connected respectively to the first and second low impedance differential output voltage nodes 48 and 50 as shown. A fifth current source provides a constant current of magnitude $I_1$ and is connected to the collector of the self-biased transistor Q4. The transistors Q3 and Q4 form a current mirror circuit such that the current flowing through the transistor Q3 ($I_{Q3}$) is equal to the current flowing through the transistor Q4 ($I_{Q4}$). Differential current means 58 shown bounded by broken lines are connected to the first and second output nodes 48 and 50 for clamping the differential voltage output of the amplifier 40. In this embodiment, the differential current means 58 includes a pair of NPN type transistors Q7 and Q8 each having their collectors connected to the selected positive supply voltage $+V$ and their bases connected respectively to the first and second differential voltage output nodes 48 and 50. The emitters of the transistors Q7 and Q8 are cross-connected as shown to the differential voltage output nodes 48 and 50. The total capacitance $C_{CTL}$ at the control node 36 is shown as a capacitor symbol formed with broken lines connected between the node and ground. In this embodiment, $C_{CTL}$ includes the junction capacitances of the transistors Q9, Q1 and Q5. As such, it has a value of approximately 3pF. The power supply 56 is of conventional design and includes resistors R1 through R10 inclusive and transistors Q9 through Q15 inclusive connected as shown. Typical values for the resistors shown in the schematic of FIG. 3 are given in Table 1 below. All resistance values are in ohms.

| R1 = 1K | R6 = 5K |
| R2 = 1K | R7 = 5K |
| R3 = 5K | R8 = 5K |
| R4 = 5K | R9 = 1K |
| R5 = 5K | R10 = 82K |

Figure 4:
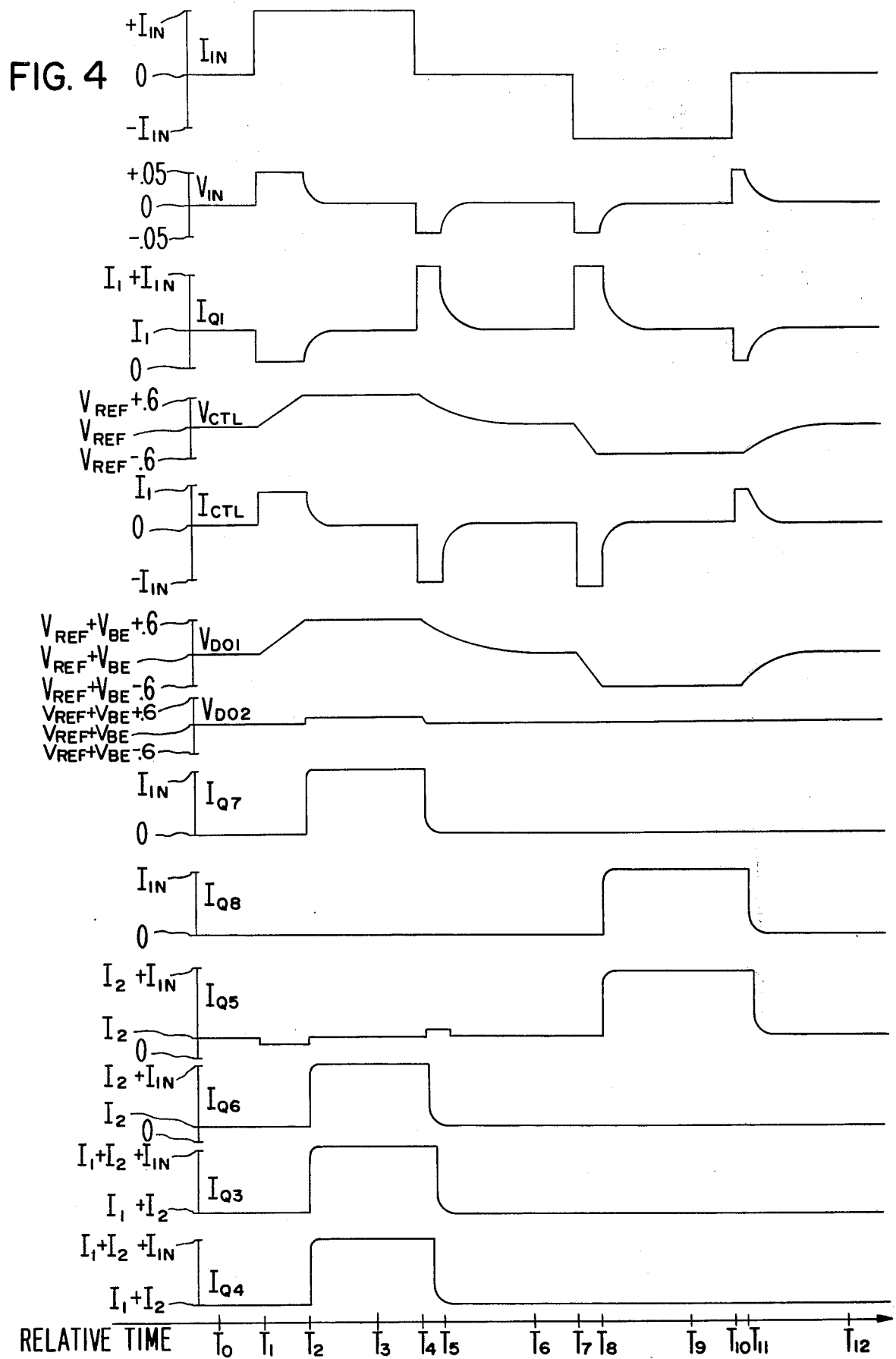
FIG. 4 is a stylized graphical representation of selected currents and voltages associated with the circuit of FIG. 3.

The operation of the circuit of FIG. 3 is best understood by reference to FIG. 4 which is a highly stylized graphical representation of selected currents and voltages present in the FIG. 3 circuit as a changing bipolar input current $I_{IN}$ is applied at the summing node 14. The waveform labeled $V_{IN}$ represents the voltage at the summing node. The waveform labeled $I_{Q1}$ represents the current flowing through the transistors Q1. The waveform labeled $V_{CTL}$ represents the voltage at the control node 36. The waveform labeled $I_{CTL}$ represents the current at the control node 36 which both charges and discharges the capacitance $C_{CTL}$. Still proceeding downward, the next two waveforms in FIG. 4 are labeled $V_{DO1}$ and $V_{DO2}$. These waveforms represent respectively the differential output voltages present at the first and second low impedance differential output nodes 48 and 50. The remaining six waveforms represent the currents flowing as indicated in FIG. 3 through the six transistors Q7, Q8, Q5, Q6, Q3 and Q4, and are correspondingly labeled $I_{Q7}$, $I_{Q8}$, $I_{Q5}$, $I_{Q6}$, $I_{Q3}$ and $I_{Q4}$ respectively.

In the discussion of circuit operation which follows, the following assumptions have been made. $+V = +5$ volts; $-V = -5$ volts; $V_{REF} = 2.5$ volts; $I_1 = 100$ μA; $I_2 = 100$ μA: $\pm I_{IN=} \pm 200$μA; $C_{CTL} = 3$pF; the characteristic base emitter voltage for all the transistors in the circuit $V_{BEZ} = 0.6$ volts; and all of the transistors have sufficiently high Beta values to ensure that any errors produced are insignificant. It is further assumed that the low impedance differential voltage output nodes 48 and 50 are connected to a pair of high impedance (100K ohms) differential inputs on an output buffer amplifier means 60 for providing an output signal compatible with the input requirements of the digital logic circuitry 20 shown in FIG. 2.

At relative time $T_0$ the net input current $I_{IN}$ at the summing node 14 is zero. All of the currents and voltages represented by waveforms in FIG. 4 are static and have substantially the values indicated. At time $T_1$ a positive input current of magnitude $+I_{IN}(+200\text{mA})$ is applied at the summing node 14 causing the current $I_{Q1}$ to stop flowing thereby diverting the constant current of magnitude $I_1$ from the collector of the transistor Q9 into the current $I_{CTL}$. The voltage at the summing node $V_{IN}$ moves up about 0.05 volts because of the low impedance (approximately 250 ohms) at that node. The current $I_{Q5}$ decreases slightly because of the temporarily excessive current at the feedback node 46. The current $I_{CTL}$ charges the capacitance $C_{CTL}$ causing the voltage $V_{CTL}$ to ramp up at a rate equal to $I_{CTL}$ divided by $C_{CTL}$. The voltage $V_{DO1}$ at the first low impedance differential output node 48 follows $V_{CTL}$ up. At time $T_2$ the voltage $V_{DO1}$ has risen 0.6 volts (one characteristice $V_{BE}$) turning the transistor Q7 on thereby causing the current $I_{Q7}$ to flow. The current $I_{Q7}$ combines additively with the constant current of magnitude $I_2$ flowing from the collector of the transistors Q12 thereby causing the currents $I_{Q6}$ and $I_{Q4}$ to increase. Because the flow of current in the transistor Q3 is regulated by the flow of current in the transistor Q4, an increase in the current $I_{Q4}$ allows the net input current $I_{IN}$ to flow together with the current $I_{Q1}$ into the feedback node 46 increasing the current $I_{Q3}$. Because the constant current of magnitude $I_1$ flowing from the collector of the transistor Q9 can again flow as the current $I_{Q1}$, the current $I_{CTL}$ falls to zero stabilizing the voltages $V_{CTL}$ and $V_{DO1}$. Because the net input current flow at the summing node 14 has been nulled, the voltage $V_{IN}$ returns to zero. At time $T_3$ all of the currents and voltages represented by waveforms in FIG. 4 have stabilized to substantially the values indicated. At time $T_4$ the net input current $I_{IN}$ changes the values indicated. At time $T_4$ the net input current $I_{IN}$ changes from $+I_{IN}(+200\mu A)$ to zero. This change in the current $I_{IN}$ causes the voltage $V_{IN}$ to decrease to $-0.05$ volts and causes the current $I_{CTL}$ to flow from the capacitance $C_{CTL}$ at a magnitude equal to the magnitude of current change at the summing node 14 (200μA). The current $I_{CTL}$ combines with the constant current of magnitude $I_1$ flowing from the collector of the transistor Q9 increasing the current $I_{Q1}$. As the current $I_{CTL}$ discharges the capacitance $C_{CTL}$, the voltage $V_{CTL}$ at the control node 36 decreases taking the voltage $V_{DO1}$ with it. A small change in the voltage $V_{DO1}$ turns the transistor Q7 off causing the currents $I_{Q7}$, $I_{Q6}$, $I_{Q4}$ and $I_{Q3}$ to fall in rapid succession. At time $T_5$ the voltage $V_{IN}$ begins to increase towards zero because the reduced conductance of the transistor Q3 has made $I_{Q3}$ equal $I_1 + I_2$. The voltages $V_{CTL}$ and $V_{DO1}$ decrease exponentially as the current $I_{CTL}$ returns to zero decreasing the magnitude of the current $I_{Q1}$ to the magnitude of the constant current $I_1$. At time $T_6$ all of the voltages and currents represented by waveforms in FIG. 4 have returned to the static values they possessed at time $T_0$.

At time $T_7$ the net input current $I_{IN}$ at the summing node 14 changes to $-I_{IN}$ ($-200\mu A$). This current change causes the voltage $V_{IN}$ to decrease to approximately $-0.05$ volts and causes the current $I_{CTL}$ to discharge the capacitance $C_{CTL}$. The magnitude of the current $I_{CTL}$ is equal to the change in current at the summing node 14 (200μA) and increases the current $I_{Q1}$ by that amount. As the capacitance $C_{CTL}$ discharges, the voltage $V_{CTL}$ ramps down at a rate of $I_{CTL}$ divided by $C_{CTL}$ taking the voltage $V_{DO1}$ with it. At time $T_8$ the voltage $V_{DO1}$ has decreased 0.6 volts (one characteristic $V_{BE}$) thereby turning the transistor Q8 on and causing the current $I_{Q8}$ to flow. The current $I_{Q8}$ combines additively with the constant current of magnitude $I_2$ flowing from the collector of the transistor Q11 to increase the current $I_{Q5}$. Because the conductance of the transistor Q3 is not increased, the current $I_{Q3}$ remains constant. The difference in current, $I_{Q5} - I_{Q3}$, flows from the feedback node 46 to the summing node 14 nulling the net input current $-I_{IN}$. This nulling current moves the voltage $V_{IN}$ and the current $I_{CTL}$ towards zero thereby stabilizing the voltages $V_{CTL}$ and $V_{DO1}$ and reducing the magnitude of the current $I_{Q1}$ to $I_1$. At time $T_9$ all of the currents and voltages represented by waveforms in FIG. 4 have stabilized at the values indicated. At time $T_{10}$ the net input current $I_{IN}$ at the summing node 14 changes to zero. This current change causes the voltage $V_{IN}$ to increase 0.05 volts because of that portion of the current $I_{Q5}$ flowing from the feedback node 46 toward the summing node 14. The current $I_{Q1}$ ceases to flow and the constant current of magnitude $I_1$ flowing from the collector of the transistor Q9 flows as the current $I_{CTL}$ to charge the capacitance $C_{CTL}$. Initially, the voltages $V_{CTL}$ and $V_{DO1}$ ramp up at the same rate experienced between the time $T_1$ and $T_2$. However, only a small increase in the voltage $V_{DO1}$ is required to greatly decrease the conductance of the transistor Q8 thereby reducing the currents $I_{Q8}$ and $I_{Q5}$. The decrease of current $I_{Q5}$ causes the voltage $V_{IN}$ to decrease thereby increasing the current $I_{Q1}$ and decreasing the current $I_{CTL}$ more slowly and the voltages $V_{CTL}$ and $V_{DO1}$ increase exponentially. At time $T_{12}$ all of the currents and voltages represented graphically in FIG. 4 have returned to the static values indicated previously at the times $T_0$ and $T_6$.

Figure 5:
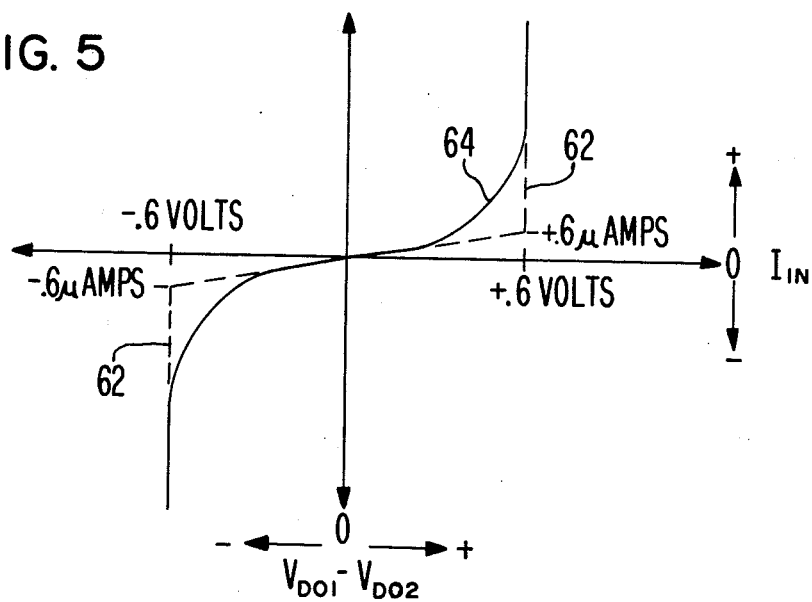
FIG. 5 is a stylized graphical representation of the transfer function associated with the circuit of FIG. 3.

FIG. 5 is a stylized graphical representation of the input/output transfer function associated with the circuit of FIG. 3. The broken lines 62 represent the theoretical ideal function shape. The solid waveform 64 represents the actual transfer function. The assumptions made with respect to the waveforms shown in FIG. 4 apply equally to FIG. 5.

The bipolar current sensing structure 30 shown in FIG. 3 can be employed together with the output buffer amplifier means 60 to replace the current comparator 30 shown as a functional block in the improved A/D converter 28 of FIG. 2. Assuming such a replacement to have been made, the total parasitic capacitance at the summing node $C_x$ remains the same as in the prior art A/D converter 10 shown in FIG. 1, i.e., approximately 30pF. In contrast, the effective summing node load resistance $R_x'$ is approximately 250 ohms which is substantially less than the load resistance $R_x$ (10K ohms) in the prior art converter 10.

As explained above, the prior art A/D converter 10 shown in FIG. 1 requires approximately 1500nS to perform a trial conversion with 12-bit resolution and a 2000μA full scale output current from the D/A converter 16.

The improved A/D converter of FIG. 2 requires only 500nS to perform a similar conversion.

The present invention is scheduled for production in integrated circuit form as part of a new A/D converter bearing Fairchild part no. μA9702.

From the foregoing detailed description, it will be evident that there are a number of changes, adaptations and modifications of the present invention which come within the province of those skilled in the art; however, it is intended that all such variations not departing from the spirit of the invention be considered as within the scope thereof as limited solely by the appended claims.

What is claimed is:

1. An improved analog-to-digital converter of the type possessing a summing node, an analog signal input circuit for providing a to-be-measured input current to said summing node, and digital-to-analog converter circuit for providing a series of trial currents to said summing node, each trial current for a predetermined period of time and each trial current related to a digital number wherein the improvement comprises:

a sensing circuit connected to said summing node for sensing the polarity of net current at said summing node at a selected time within each said predetermined period, wherein said sensing circuit includes low impedance input circuit connected to said summing node for providing a single-ended control voltage in response to bipolar input currents at said summing node, said input means including first and second current sources each of which provides a constant current of magnitude $I_1$, and first and second NPN type transistors each possessing a respective emitter, collector and base, said first and second constant current sources connected respectively to said first and second collectors, said second collector and said first and second bases connected together, said first emitter forming said single ended control voltage provided at said first collector;

a source of selected reference voltage; and a differential amplifier circuit possessing a first input connected to said single ended control voltage, a second node connected to said reference voltage, a current feedback node connected to said summing node, and first and second low impedance differential output voltage nodes for providing an input current nulling feedback current at said summing node and a selected one of two stable differential voltage relationships at said output nodes when said input current is of one polarity and the other stable differential voltage relationship when said input current is of the other polarity, said differential amplifier including third and fourth current sources each of which provides a constant current of magnitude $I_2$; a fifth current source which provides a constant current of magnitude $I_1$; a source of selected negative supply voltage; third and fourth NPN type transistors each possessing a respective emitter, collector and base, said fifth current source connected to the interconnection of said third base, said fourth base and said fourth collector, said third and fourth emitters connected to said selected negative supply voltage; fifth and sixth PNP type transistors each possessing a respective emitter, collector and base, said third and fourth constant current sources connected respectively to said fifth and sixth emitters forming respectively said first and second low impedance differential output voltage nodes, said fifth collector connected to said third collector forming said current feedback node, said sixth collector connected to said fourth collector, said fifth and sixth bases forming respectively said first and second inputs; and a differential current circuit connected to said first and second output nodes for clamping said selected one of two stable differential voltage relationships at said output nodes when said input current is of one polarity and said other stable differential voltage relationship when said input current is of the other polarity; wherein said differential current means includes a source of selected positive supply voltage; and seventh and eighth NPN type transistors each possessing a respective emitter, collector and base, said seventh and eighth collectors connected to said selected positive supply voltage, said seventh and eighth bases connected respectively to said first and second differential voltage output nodes, said seventh emitter cross-connected to said second output node and said eighth emitter cross-connected to said first output node.

2. A bipolar current sensing structure comprising:

an input circuit possessing a low impedance summing node for providing a single ended control voltage in response to bipolar input currents at said summing node; said input circuit including first and second current sources each of which provides a constant current of magnitude $I_1$; and first and second NPN type transistors each possessing a respective emitter, collector and base, said first and second constant current sources connected respectively to said first and second collectors, said second collector and said first and second bases connected together, said first emitter forming a single ended control voltage provided at said first collector;

a source of selected reference voltage;

a differential amplifier circuit possessing a first input connected to said single ended control voltage, a second input connected to said reference voltage, a current feedback node connected to said summing node, and first and second low impedance differential output voltage nodes for providing an input current nulling feedback current at said summing node and a selected one of two stable differential voltage relationships at said output nodes when said input current is of one polarity and the other stable differential voltage relationship when said input current is of the other polarity, said differential amplifier circuit including third and fourth current sources each of which provides a constant current of magnitude $I_2$; a fifth current source which provides a constant current of magnitude $I_1$; a source of selected negative supply voltage; third and fourth NPN type transistors each possessing a respective emitter, collector and base, said fifth current source connected to the interconnection of said third base, said fourth base and said fourth collector, said third and fourth emitters connected to said selected negative supply voltage; fifth and sixth PNP type transistors each possessing a respective emitter, collector and base, said third and fourth constant current sources connected respectively to said fifth and sixth emitters forming respectively said first and second low impedance differential output voltage nodes, said fifth collector connected to said third collector forming said current feedback node, said sixth collector connected to said fourth collector, said fifth and sixth bases forming respectively said first and second inputs; and a differential current circuit connected to said first and second output nodes for clamping said selected one of two stable differential voltage relationships at said output nodes when said input current is of one polarity and said other stable differential voltage relationship when said input current is of the other polarity, said differential current circuit including a source of selected positive supply voltage; and seventh and eighth NPN type transistors each possessing a respective emitter, collector and base, said seventh and eighth collectors connected to said selected positive supply voltage, said seventh and eighth bases connected respectively to said first and second differential voltage output nodes, said seventh emitter cross-connected to said second output node and said eighth emitter cross-connected to said first output node.

* * * * *